United States Patent
Nikuie et al.

(10) Patent No.: US 9,477,562 B1
(45) Date of Patent: Oct. 25, 2016

(54) APPARATUS AND METHOD FOR MINIMIZING EXCLUSIVE-OR (XOR) COMPUTATION TIME

(71) Applicant: Microsemi Storage Solutions (US), Inc., Aliso Viejo, CA (US)

(72) Inventors: Mohammad Nikuie, Saratoga, CA (US); Ihab Jaser, San Jose, CA (US)

(73) Assignee: Microsemi Storage Solutions (US), Inc., Aliso Viejo, CA (US)

(*) Notice: Subject to any disclaimer, the term of this patent is extended or adjusted under 35 U.S.C. 154(b) by 77 days.

(21) Appl. No.: 14/694,986

(22) Filed: Apr. 23, 2015

(51) Int. Cl.
  *G06F 11/00* (2006.01)
  *G06F 11/20* (2006.01)
  *G06F 3/06* (2006.01)

(52) U.S. Cl.
  CPC ............ *G06F 11/2017* (2013.01); *G06F 3/061* (2013.01); *G06F 3/0646* (2013.01); *G06F 3/0689* (2013.01)

(58) Field of Classification Search
  CPC .. G06F 11/2017; G06F 3/061; G06F 3/0646; G06F 3/0689
  See application file for complete search history.

(56) References Cited

U.S. PATENT DOCUMENTS

| | | | |
|---|---|---|---|
| 4,918,600 A * | 4/1990 | Harper, III | G06F 12/0607 711/157 |
| 8,156,401 B2 | 4/2012 | King et al. | |
| 8,539,326 B1 * | 9/2013 | Nethercot | G06F 11/10 707/699 |

OTHER PUBLICATIONS

Deng, et al., "Self-Adjusting Constrained Random Stimulus Generation Using Splitting Evenness Evaluation and XOR Constraints," Asia and South Pacific Automation Conference, Yokohama, pp. 769-774 (Jan. 19-22, 2009).*

* cited by examiner

*Primary Examiner* — Albert Decady
*Assistant Examiner* — Kyle Vallecillo
(74) *Attorney, Agent, or Firm* — Glass & Associates; Kenneth Glass; Mark Peloquin

(57) ABSTRACT

A line of data is read from a line of memory. Intended data is specified by a random location and a random size within the line of memory. The line of data is moved into temporary storage. The line of data and a zero are multiplexed using a control signal to output a line of adjusted data which is automatically aligned to an initial point in an XOR buffer. A starting index of the intended data within the line of adjusted data corresponds to the initial point within an XOR buffer. An XOR operation is performed on the line of adjusted data and a line of data read from the XOR buffer to obtain a modified line of XOR data. The modified line of XOR data is written back to the XOR buffer at the same buffer locations as the line of data read from the XOR buffer.

20 Claims, 17 Drawing Sheets

FIG 3

| INPUT | | OUTPUT |
|---|---|---|
| 304<br>A | 306<br>B | 308<br>C = A XOR B |
| 0 | 0 | 0 |
| 0 | 1 | 1 |
| 1 | 0 | 1 |
| 1 | 1 | 0 |

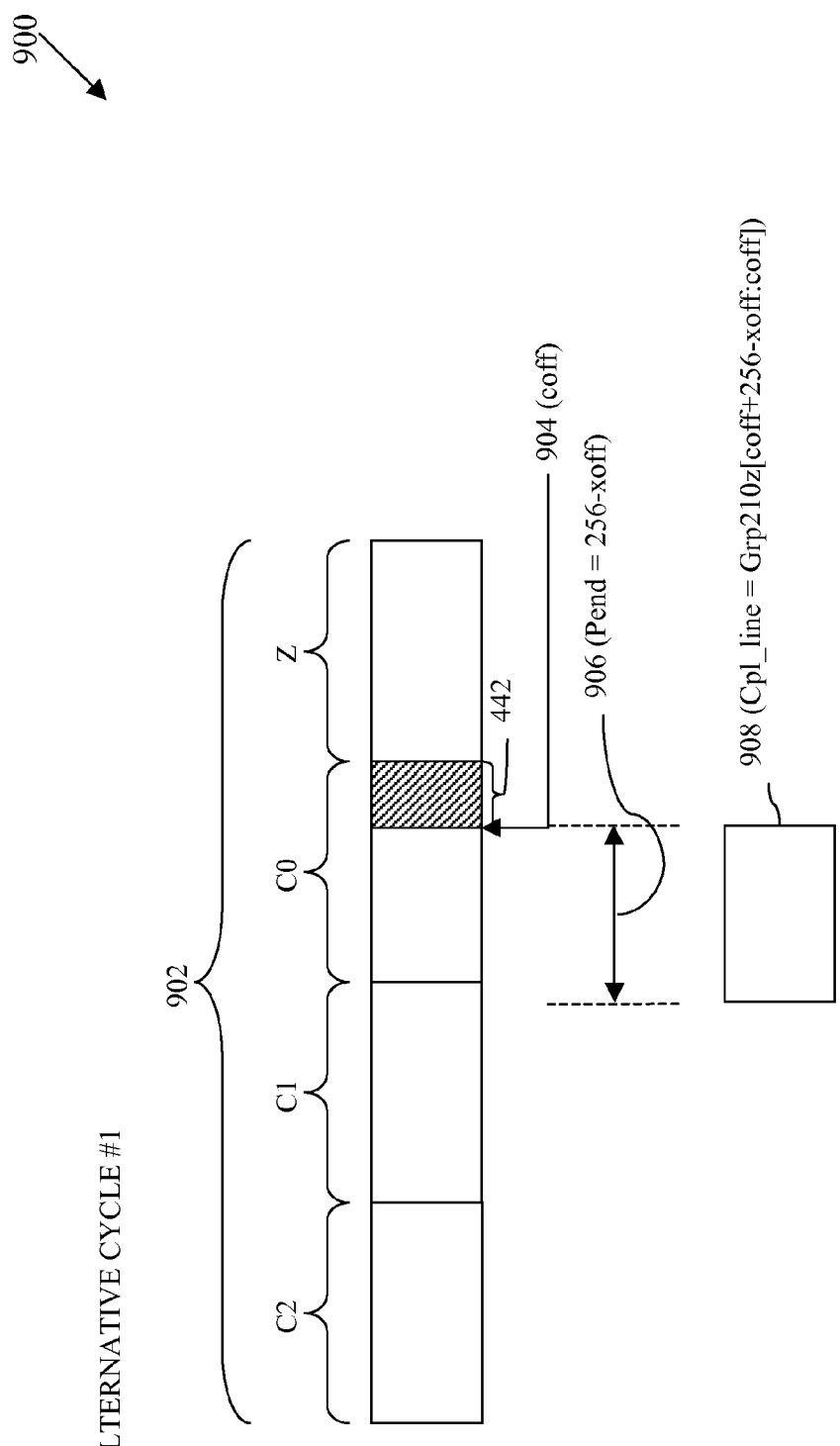

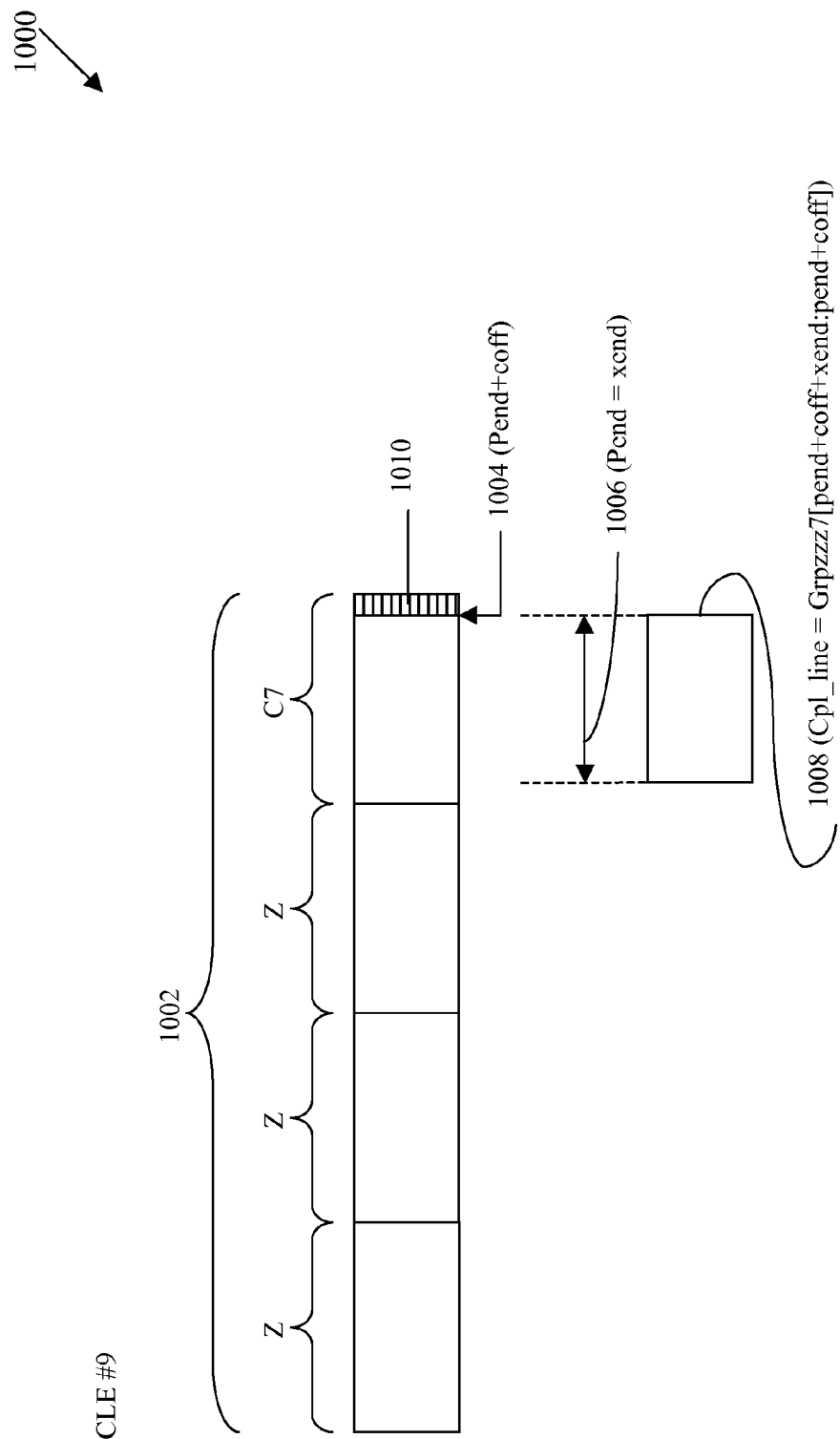

FIG 11B

| Cycle No. | 1154 | 1156 |
|---|---|---|
| | | Alternative Form |
| 1 | Cpl_line = Grp3210[coff+256-xoff:coff] | Cpl_line = Grp210z[coff+256-xoff+256:coff+256] |
| 2 | Cpl_line = Grp3210[pend+coff+256:pend+coff] | |
| 3 | Cpl_line = Grp4321[pend+coff+256:pend+coff] | |
| 4 | Cpl_line = Grp5432[pend+coff+256:pend+coff] | |
| 5 | Cpl_line = Grp6543[pend+coff+256:pend+coff] | |
| 6 | Cpl_line = Grp7654[pend+coff+256:pend+coff] | |
| 7 | Cpl_line = Grpz765[pend+coff+256:pend+coff] | |
| 8 | Cpl_line = Grpzz76[pend+coff+xend:pend+coff] | |
| 9 | Cpl_line = Grpzzz7[pend+coff+xend:pend+coff] | |

| 1302 | Clock Cycle | 0 | 1 | 2 | 3 | 4 | ..... |
|---|---|---|---|---|---|---|---|
| 1304 | XOR Read Address | A0 | A1 | A2 | A3 | A4 | ..... |
| 1306 | XOR Read Data | x | x | D0 | D1 | D2 | ..... |
| 1308 | XOR Write Address | -- | -- | A0 | A1 | A2 | ..... |
| 1310 | XOR Write Data | -- | -- | W0 | W1 | W2 | ..... |

APPARATUS AND METHOD FOR MINIMIZING EXCLUSIVE-OR (XOR) COMPUTATION TIME

BACKGROUND OF THE INVENTION

1. Field of Invention

The invention relates generally to data redundancy, and more specifically to apparatuses and methods for increasing the execution speed of an exclusive-OR (XOR) process.

2. Art Background

In data processing systems, hardware failure is an ever present possibility which system providers must anticipate and provide for in system designs so that data integrity is preserved and the user experience can be free from data loss. Thus, data protection and recovery is paramount to the user experience. There are various ways of providing data protection. Techniques such as Random Array of Independent Disks (RAID) have been developed to provide redundant storage of data on multiple disk drives since the possibility of simultaneous failure of more than one disk drive at a time is very low. RAID5 is one of several RAID architectures that can be used to provide data redundancy. In RAID5, redundant data is calculated and then the original data and the calculated redundant data are distributed across multiple storage devices. Redundant data is calculated with an exclusive-OR (XOR) operation. In the case of a disk or storage system failure, the redundant data is used to recover the original data. Calculation of redundant data during the XOR operation presents extra computation cycles for the data processing system which can slow down system performance. This can present a problem.

XOR operation is an essential part of any RAID data protection system. Redundant data, calculated with an XOR process, must be computed efficiently with minimum impact to system performance. As user data flows from volatile memory to a storage device, it must be XORed with its corresponding XOR buffer. This operation may occur many times as pieces of data flow through, thereby requiring an XOR operation to be performed at different specific locations in the XOR buffer. User data can have an offset in memory which differs from its corresponding offset in an XOR buffer. An approach to this problem of different offsets may require a system to have a fixed offset or place other restrictions on the memory architecture which will limit the usefulness or flexibility of the system such as increasing clock cycles needed to move an amount of data. All of this presents a problem.

SUMMARY

In one or more embodiments, a method to increase exclusive-OR (XOR) computation speed, includes reading a line of data from a line of memory. Intended data is specified by a random location and a random size within the line of memory. The line of data is moved into temporary storage. The line of data and a zero are multiplexed using a control signal to output a line of adjusted data. A starting index of the intended data within the line of adjusted data corresponds to an initial point within an XOR buffer. An XOR operation is performed on the line of adjusted data and a line of data read from the XOR buffer to obtain a modified line of XOR data. The modified line of XOR data is written back to the XOR buffer at the same buffer locations as the line of data read from the XOR buffer.

In one embodiment, a command that initiates the reading is accompanied with the random location, the initial point, and the random size. In one or more embodiments, the temporary storage is constructed with an array of flip-flops. In one embodiment, the array is organized in eight lines of 256 flip-flops per line.

In one embodiment, four successive lines of the array are concatenated into a group during a given cycle. In one embodiment, the eight lines are concatenated into eight groups of four successive lines, wherein a first group 3210 includes lines 3, 2 1, and 0, a second group 4321 includes lines 4, 3, 2, and 1, a third group 5432 includes lines 5, 4, 3, and 2, a fourth group 6543 includes lines 6, 5, 4, and 3, a fifth group 7654 includes lines 7, 6, 5, and 4, a sixth group z765 includes lines z, 7, 6, and 5, a seventh group zz76 includes lines z, z, 7, and 6, and an eighth group zzz7 includes lines z, z, z, and 7, where z represents unusable storage area. In one embodiment, the first group 3210 alternatively includes lines 2, 1, 0, and z where z represents unusable storage area. In one embodiment, the second group alternatively includes lines 3, 2, 1, and 0.

The multiplexing outputs adjusted data. The adjusted data is zero padded at all locations below the starting index and above the random size of intended data. A stripe size of a redundant array of independent disks (RAID) is related to the random size of the intended data.

In one or more embodiments steps A, B, and C are performed in the same clock cycle, the method includes: (A) reading XOR buffer data from address n; (B) wherein the performing uses XOR buffer data read from address n−2 and corresponding adjusted data to obtain an XOR output; and (C) wherein the writing writes the XOR output from Step (B) to address n−2.

In one or more embodiment, the performing uses adjusted data, which is output from a multiplexer. A line of data is read from a line of memory. Intended data is specified by a random location and a random size within the line of memory. The line of data is loaded into temporary storage. The line of data and a zero value are multiplexed using a control signal to output a line of adjusted data. A starting index of the intended data within the line of adjusted data corresponds to an initial point within an XOR buffer.

In one or more embodiments, a system to increase exclusive-OR (XOR) calculation speed includes a processor. The processor issues a command to move data from a memory to temporary storage. The command specifies intended data at a random location and of a random size within the memory and an initial point within an XOR buffer. Control logic forms at least one group of lines within the temporary storage and provides a control signal using the command. A multiplexer is controlled by the control signal. The multiplexer multiplexes data from the at least one group of lines and a zero value to output adjusted data in alignment with the initial point within the XOR buffer. An XOR circuit receives inputs of adjusted data and data read from an XOR buffer. An output of the XOR circuit is written back to the XOR buffer at the same XOR buffer locations as the data read from the XOR buffer.

In one or more embodiments, the random location and the random size is relative to a line of the memory. The control logic uses the command to provide the control signal to the multiplexer in order to output adjusted data such that a starting index of the intended data corresponds to the initial point within the XOR buffer. Zero values exist in the adjusted data before the starting index and after the random size of the intended data.

In one embodiment, system timing is configured to read address n of the XOR buffer and to write to address n−2 of the XOR buffer during the same clock cycle.

In one embodiment, the output (c) of the XOR module is part of a redundant array of independent disks (RAID) stripe. In one embodiment, the level of RAID is RAID5. In one embodiment, a stripe size is related to the random size of the intended data.

In one embodiment, a maximum offset in the temporary storage array is within a range of 0 to 992, and a maximum offset into the XOR buffer is within a range of 0 and 992.

In one embodiment, the memory is a dynamic random access memory (DRAM) device.

In one or more embodiments, an apparatus to increase exclusive-OR (XOR) calculation speed includes control logic which is used to form at least one group of lines within a temporary storage array and to provide a control signal using a command issued from a processor. The temporary storage array receives data from a memory in response to the command. A multiplexer is controlled by the control signal and multiplexes data from the at least one group of lines and a zero value to output adjusted data. An XOR circuit receives inputs of adjusted data and data read from an XOR buffer. An output of the XOR circuit is written back to the XOR buffer at the same XOR buffer locations as the data read from the XOR buffer.

In one or more embodiments, the command contains a request for intended data at a random location and of a random size within a line of the memory, and a corresponding initial point within an XOR buffer. The control logic uses the command to provide the control signal to output the adjusted data such that a starting index of the intended data corresponds to the initial point within the XOR buffer. Zero values exist in the adjusted data before the starting index and after the random size of the intended data.

BRIEF DESCRIPTION OF THE DRAWINGS

The invention may best be understood by referring to the following description and accompanying drawings that are used to illustrate embodiments of the invention. The invention is illustrated by way of example in the embodiments and is not limited in the figures of the accompanying drawings, in which like references indicate similar elements.

FIG. 3 illustrates results of an exclusive-OR (XOR) operation as used in embodiments of the invention.

FIG. 9 illustrates an alternative logical grouping of temporary storage for a first cycle from the architecture presented in FIG. 4A and FIG. 4B, according to embodiments of the invention.

FIG. 10 illustrates a logical grouping of temporary storage for a ninth cycle from the architecture presented in FIG. 4A and FIG. 4B, according to embodiments of the invention.

FIG. 11B illustrates equations for variables used in conjunction with the architecture of FIG. 4A through FIG. 11A, according to embodiments of the invention.

FIG. 13 illustrates a data pipeline for accomplishing one clock cycle exclusive-OR (XOR) process, according to embodiments of the invention.

DETAILED DESCRIPTION

In the following detailed description of embodiments of the invention, reference is made to the accompanying drawings in which like references indicate similar elements, and in which is shown by way of illustration, specific embodiments in which the invention may be practiced. These embodiments are described in sufficient detail to enable those of skill in the art to practice the invention. In other instances, well-known circuits, structures, and techniques have not been shown in detail in order not to obscure the understanding of this description. The following detailed description is, therefore, not to be taken in a limiting sense, and the scope of the invention is defined only by the appended claims.

Automatic alignment during exclusive-OR (XOR) operations is described. Data from memory having random width and random offset is automatically aligned to an XOR buffer having a random width and random offset. The automatic alignment permits a read-modify-write from/to the XOR buffer to be performed within one clock cycle, which minimizes the computation time needed for an XOR process. Minimizing computation time is used synonymously with increasing XOR computation speed herein.

Figure 1:
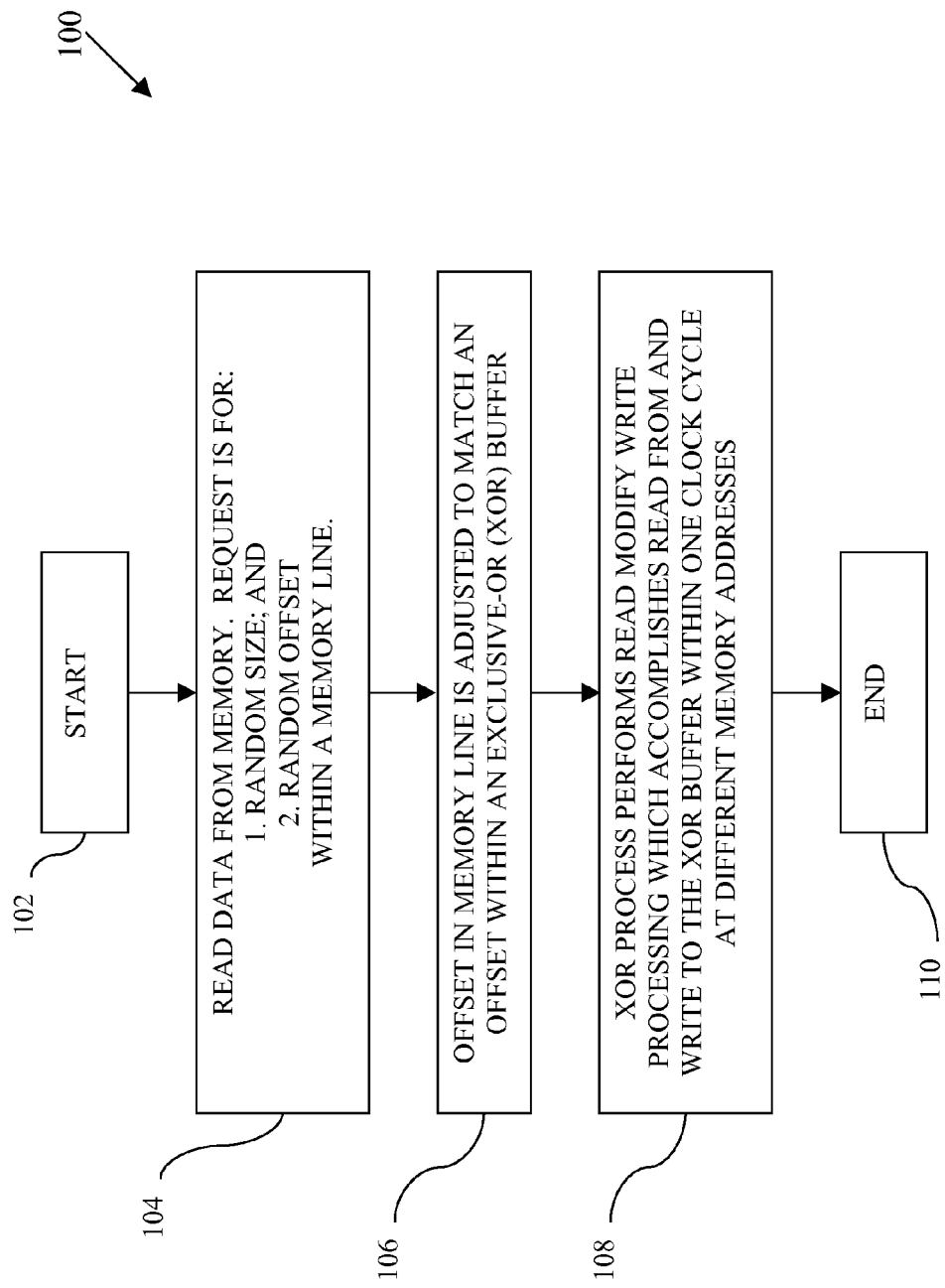
FIG. 1 illustrates a method, according to embodiments of the invention.

FIG. 1 illustrates, generally at 100, a method, according to embodiments of the invention. With reference to FIG. 1, an exclusive-OR calculation process begins at a block 102. As used in this detailed description of embodiments, redundant data calculated by an XOR process will be referred to as XOR data or XORed data. At a block 104, user data or intended data is read from memory. The memory can be, for example, a dynamic random access memory (DRAM) which is used by a processor, which can be part of a computing device such as a computer, data acquisition system, etc. Within these examples, no limitation is implied by use of DRAM as the source for the user data, as embodiments of the invention are applicable to any form of memory and process where an XOR operation is used to process data. For clarity of presentation and simplicity in use of language, DRAM will be used in this description of embodiments, however it is to be recognized that no limitation is implied thereby. The data read from DRAM at the block 104 is of random size and random offset within a memory line. Note that the chunk of data read from DRAM can be up to several memory lines long. In one or more embodiments it can be up to eight lines which is equal to 8×256=1024 bits. It can also be smaller than a memory line, e.g., 4 bytes which would be smaller than a single memory line. Embodiments of the invention are applicable to various system architectures. For example, some system architectures will be built using 256 bits per memory line. Other architectures will use more than 256 bits per memory line. And yet other architectures will use less than 256 bits per memory line. Embodiments of the invention are configured accordingly with the architecture of a given system with a number of bits used for a memory line.

As used in this description of embodiments, an "offset" of the intended data is an index into a memory line which designates where the intended data begins. Also as used in this description of embodiments, an "offset" into an XOR buffer is an index into the XOR buffer or equivalently an initial point within the XOR buffer which designates a location in the XOR buffer which corresponds to the offset of the intended data within a memory line. Alternatively, the offset of the intended data is referred to herein as a starting index of the intended data. In general, the offset of the intended data is not the same as the offset into the XOR buffer. Thus, in various embodiments, at a block 106, an offset of the intended data is aligned with a corresponding offset into the XOR buffer. Once alignment of the offsets is accomplished, the intended data is processed and the XORed results are stored "packed" into the XOR buffer. As used in this description of embodiments, "packed" is understood to mean that the first bit of the intended data and all subsequent bits, within the size specified by the read command, are processed by the XOR operation and are stored contiguously in the XOR buffer without any skipped bit locations.

At a block 108, the XOR process performs the XOR operation on the intended data and the corresponding contents of the XOR buffer. The XOR operation is performed one memory line at a time and is described more fully below with the figures that follow. During the operation of the process in the block 108 the XOR process performs a read-modify-write operation on different memory lines within the same clock cycle thereby minimizing XOR computation time or increasing XOR computation speed. The process ends at a block 110.

Figure 2:
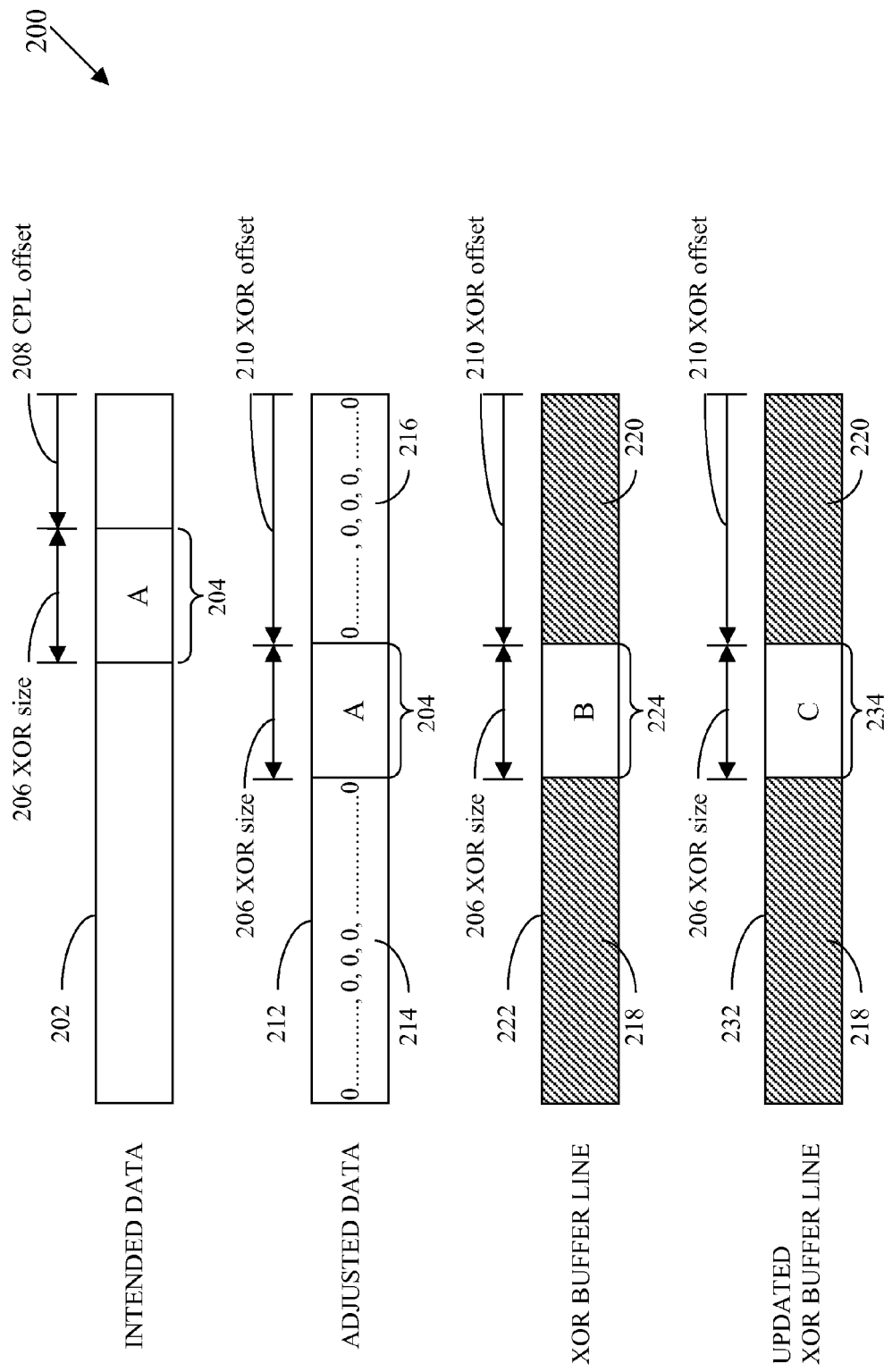
FIG. 2 illustrates automatic alignment of data, according to embodiments of the invention.

FIG. 2 illustrates, generally at 200, automatic alignment of data, according to embodiments of the invention. With reference to FIG. 2, a memory line is indicated at 202. Within memory line 202 a random amount of intended data is indicated at 204 with designation "A." The intended data A has a starting index (location) indicated by 208 "CPL offset." A width of the intended data A 204 is indicated by 206 XOR size. Note that the width of the intended data A 204 is equivalent to a width within the XOR buffer, hence the use of the term "XOR size" with reference numeral 206.

According to the systems and methods described herein the indices of the intended data 202 are adjusted resulting in adjusted data 212. Within adjusted data 212, the intended data A 204 has been shifted into alignment with an XOR buffer, such that its offset in the memory line now begins at 210 XOR offset. In addition, wherever the intended data does not exist in the line of adjusted data 212, a zero value is assigned thereto (zero padding). For example, the data values at locations before 206 XOR size (region 216) are set to zero and the data values at locations above {210 XOR offse XOR size} (region 214) are also set to zero.

An XOR buffer line, which corresponds to the adjusted data 212 is indicated at 222 before a write operation and is indicated at 232 after the write operation. Note that within the XOR buffer line 222, the locations corresponding to 204 (adjusted data 212) are indicated by 224 (XOR buffer line). It is important to preserve the integrity of the XOR buffer by not changing values in the XOR buffer which are not part of the stripe being processed. The only portion that can be updated is the portion indicated by locations 224. The portions of the XOR buffer line 222 below the XOR offset 210, indicated at 220, and above 224, indicated at 218 are to remain untouched during the XOR operation with the adjusted data 212.

Following an XOR operation with adjusted data 212 and the XOR buffer line 222 the result is written back to the XOR buffer line and is indicated as updated XOR buffer line 232. Within 232 a portion indicated as C 234 represents the updated portion of the XOR buffer line. Note that the portion 220 and 218 have remained unchanged because of the zero padding which was done to the adjusted data 212.

FIG. 3 illustrates, generally at 300, results of an exclusive-OR (XOR) operation as used in embodiments of the invention. With reference to FIG. 3, a table 302 contains two inputs to an exclusive-OR (XOR) operation which are indicated as input A in column 304 and as input B in column 306. An output {C=A XOR B} of the exclusive-OR (XOR) operation is indicated in column 308. Rows 310, 312, 314, and 316 illustrate a range of values that the inputs 304 and 306 can assume. Referring back to FIG. 2, note that by zero padding regions 214 and 216 in the adjusted data 212, the contents of regions 218 and 220 are unchanged during the XOR operation on the XOR buffer line 222 since a 0 at column 306 and row 310 results in a 0 output from the XOR operation as indicated in column 308 and row 310. Likewise, a 1 in column 306 and row 312 results in a 1 after the XOR operation as indicated in column 308 at row 312. Thus, the zero padding in the adjusted data preserves the contents of the XOR buffer line 222 which are not associated with the adjusted data A 204 (FIG. 2).

Figure 4A:
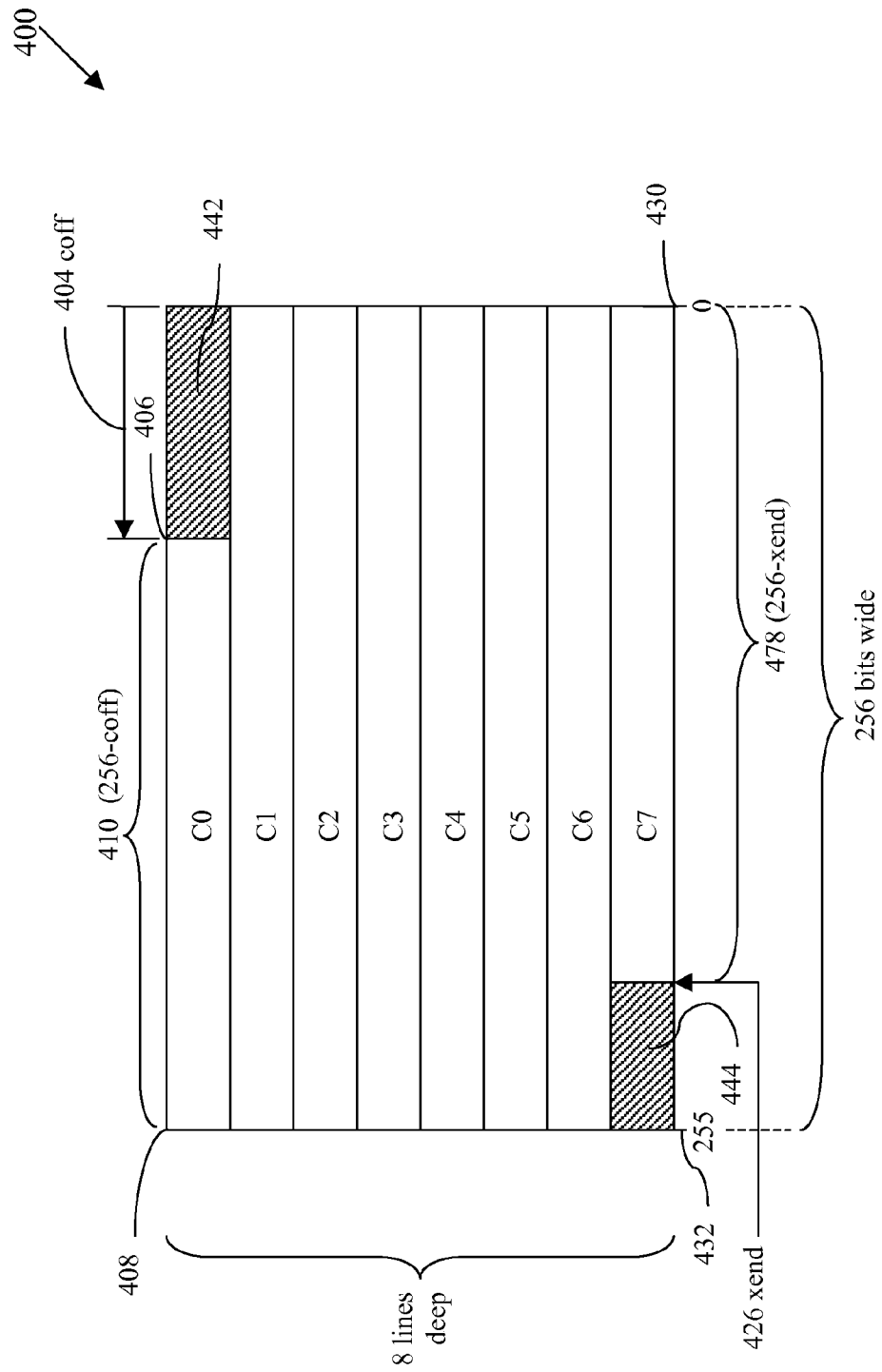
FIG. 4A illustrate an architecture for temporary storage, according to embodiments of the invention.

As described above, the intended data is moved to temporary storage prior to input into the XOR process. In various embodiments, temporary storage can be realized with different storage devices. In one or more embodiments, temporary storage is realized with an array of flip-flops. In one or more embodiments, the array of flip-flops is constructed with an array of flip-flops referred to herein as CPL flops. Different architectures are possible. In this illustration, an architecture is described which allocates a block of 256 bytes of data as the maximum amount of data that can be retrieved from memory (DRAM) at a time in response to a command issued by a processor. Each block of 256 bytes is referred to herein as a completion. This architecture, which supports a maximum of 256 bytes of intended data per completion is used for illustration and does not limit embodiments of the invention which can be configured to handle sizes other than 256 bytes. FIG. 4A illustrate, generally at 400, an architecture for temporary storage, according to embodiments of the invention. With reference to FIG. 4A, an array of CPL flops is organized in eight lines of 256, i.e., C0, C1, C2, C3, C4, C5, C6, and C7 each have 256 flops per line which together provide storage for 256 bytes of data. Each line of the CPL flops is 256 bits wide as indicated with a starting position 430, which corresponds to bit zero, and extends to bit 255 which is indicated at 432. As illustrated in FIG. 4A, the lines are filled from right to left and from the top line (C0) to the bottom line (C8) eight lines deep. A request for intended data can encompass a portion of a single line or it can span across multiple lines of the array 400. As described above, the request is characterized by random offset and random size with respect to a line of memory.

In the example shown in FIG. 4A, the request starts in line C0 at offset indicated at 404 coff and fills lines C1, C2, C3, C4, C5, C6, and ends at 426 xend on line C7. An amount of intended data which is moved into line C0 is indicated at 410

(256-coff), with starting index indicated at 406 and an end index indicated at 408 for line C0. An amount of intended data moved into line C7 is indicated at 478 (256-xend). The read request issued by the processor includes dynamic variables that are particular to the given request. These dynamic variables include, the offset into the memory line that specifies the start of the intended data (indicated by 404 coff), the size of the intended data (indicated in part by 426 xend), and a corresponding initial point within an XOR buffer (e.g., 454 in FIG. 4B). The size of the intended data is also synonymous with the size of the portion of the XOR buffer which will correspond with the intended data, which was also illustrated in FIG. 2 above. There is always a one-to-one relationship between the size of the intended data and the size of the portion of the XOR buffer which corresponds with the intended data.

Data is read from DRAM a memory a full line at a time even though the intended data might not occupy a full memory line, thus an offset into the memory line is needed. Note that the data which exists in line C0 indicated at 442 is not used in the calculation but is read anyway because of system architecture. Likewise, in line C7, the data stored in locations represented by 444 does not modify the contents of the XOR buffer because it is outside of the data size associated with the current request. Each line is read a cycle at a time. Thus, in the example of FIG. 4A, eight clock cycles are required to fill the eight lines of CPL flops.

Figure 4B:
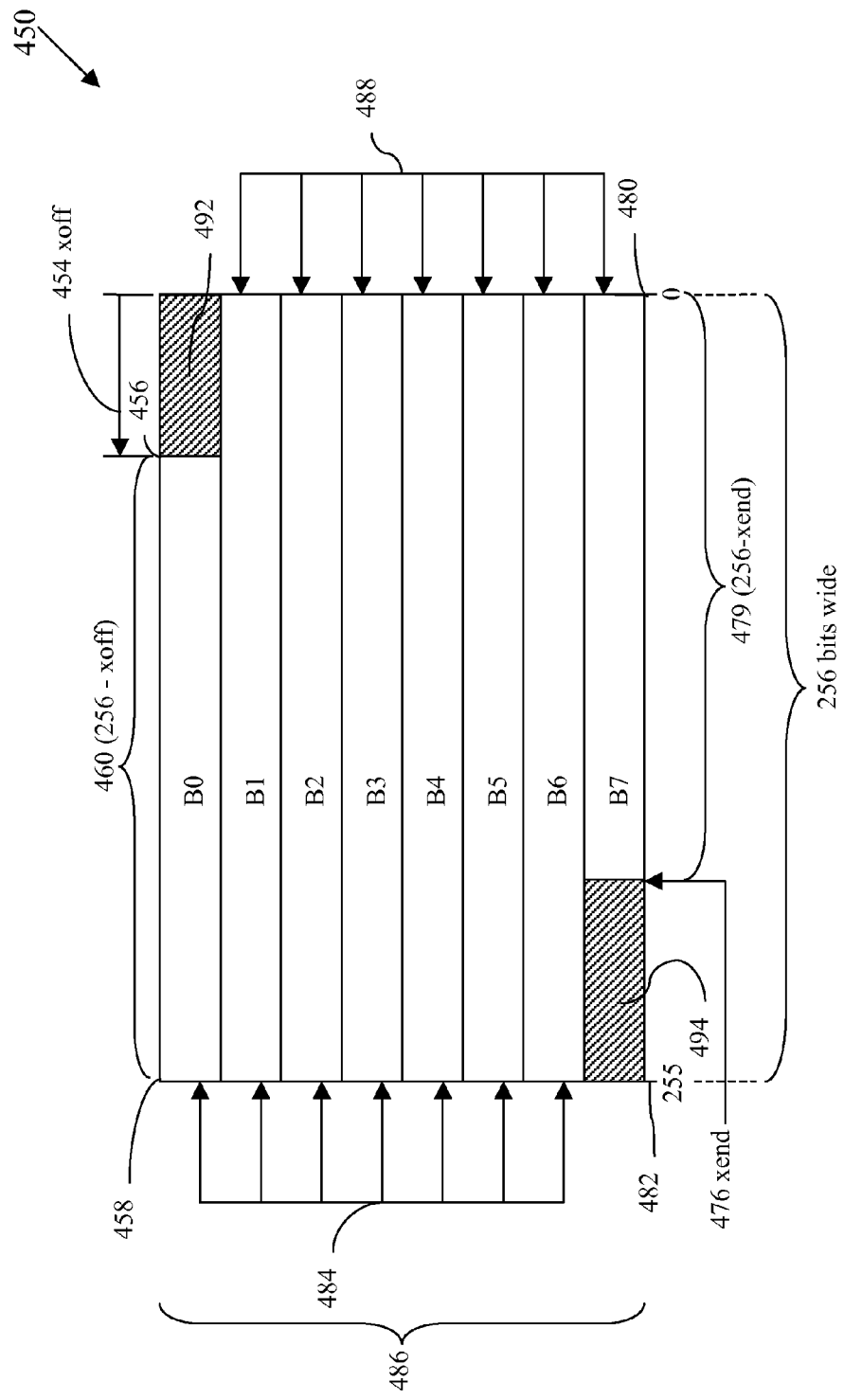
FIG. 4B illustrate an architecture for an exclusive-OR (XOR) buffer, according to embodiments of the invention.

FIG. 4B illustrate, generally at 450, an architecture for an exclusive-OR (XOR) buffer, according to embodiments of the invention. With reference to FIG. 4B, the XOR buffer 450 is constructed with one continuous block of memory, such as for example in one non-limiting embodiment RAM memory is used. Following the architecture established for the CPL flops, the XOR buffer 450 is configured in eight lines of 256 bits as indicated at 486 by B0, B1, B2, B3, B4, B5, B6, and B7. As described above, the processor issues requests for intended data which are temporarily stored in the CPL flop array 400 (FIG. 4A). A request for intended data contains a size of the intended data, an offset into the CPL flop array, and an offset into the XOR buffer. The requests for intended data are used to build a stripe of data in the XOR buffer which is ultimately written out to a storage device such as a hard disk drive, RAID array, etc. The problem of misaligned offsets is illustrated with the example of FIG. 4A and FIG. 4B, note therein that the offset into the CPL flop array (404 coff) is different from the offset into the XOR buffer (454 xoff). Data from the CPL flop array 400, starting at bit location 406 is adjusted, processed by the XOR operation to create XORed data, and the XORed data is then loaded into the XOR buffer starting at the XOR offset 454 xoff bit location 456. This process starts by creating logical groupings of the lines from the CPL flop array 400, as described below in FIG. 5 through FIG. 11B, which will then be used to create the XORed data as described below in FIG. 12.

Figure 5:
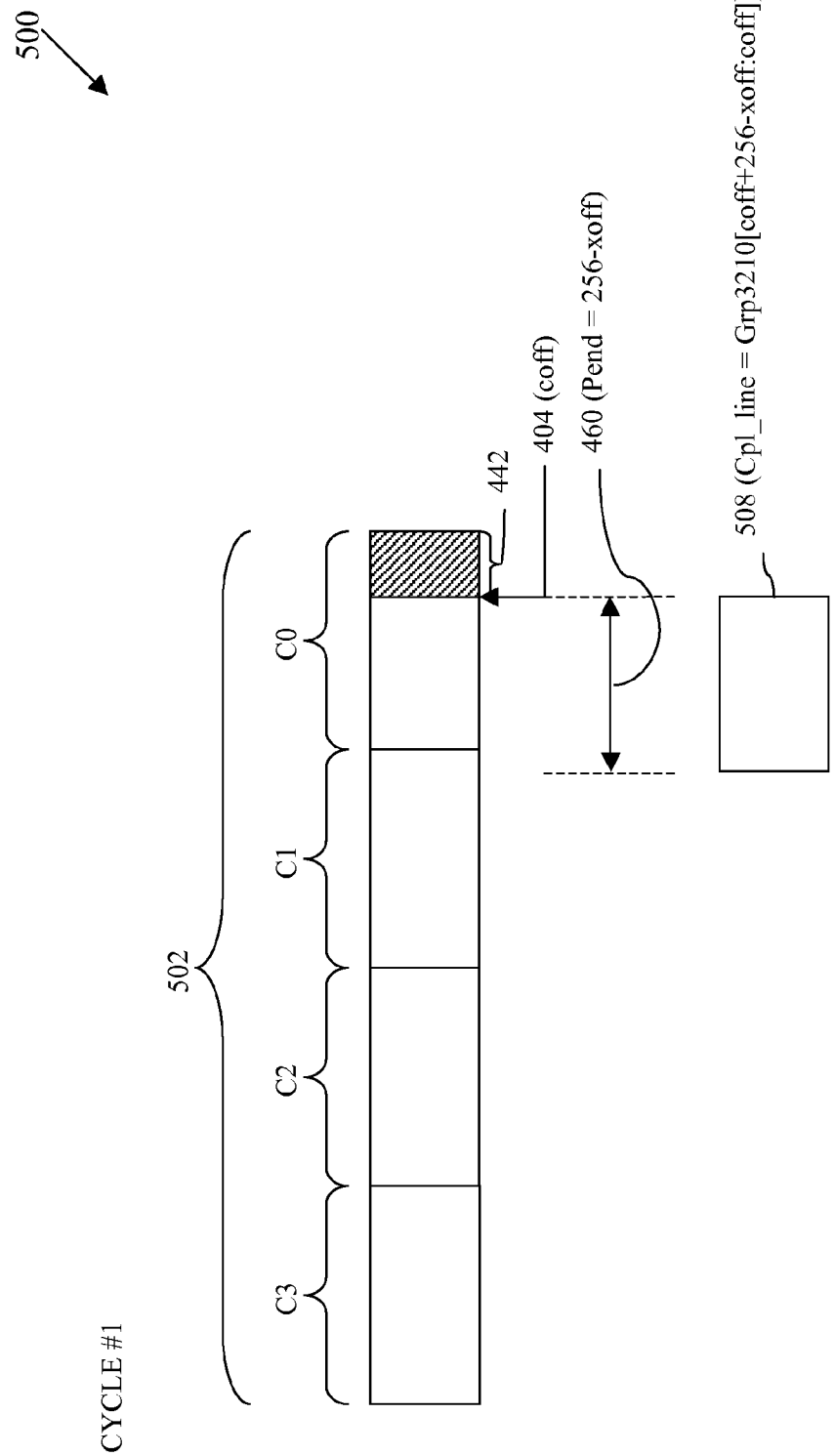
FIG. 5 illustrates a logical grouping of temporary storage for a first cycle from the architecture presented in FIG. 4A and FIG. 4B, according to embodiments of the invention.

FIG. 5 illustrates, generally at 500, a logical grouping of temporary storage for a first cycle from the architecture presented in FIG. 4A and FIG. 4B, according to embodiments of the invention. With reference to FIG. 5, completion line C3, C2, C1, and C0 are logically grouped into a group 502 which is used to shift intended data to adjusted data for use in the first cycle. For ease of illustration, the offsets shown in FIG. 4A and FIG. 4B are used again in the discussion that pertains to FIG. 5 through FIG. 10. The offset into line C0 is indicated at 404 coff in FIG. 5. Region 442 indicates bits in line C0 which are not part of the intended data are therefore skipped by virtue of the offset into the CPL array 400. The amount of data from the CPL array 400 that will correspond with the XOR buffer 450 is indicated at 460 and contains an amount of bits given by {256-xoff}. An equation used to identify this line of data for use with the B0 line of the XOR buffer 450 is given at 508 as {Cpl_line=Grp3210[coff+256-xoff:coff]}, where 3210 indicates the group formed by lines C3, C2, C1, and C0 from CPL flop array 400, starting bit location indicated by coff and ending bit location indicated by coff+256-xoff.

From the grouping illustrated, 256 bits are selected such that adjustment is made for the offset into the CPL array. In any read-modify-write operation to the XOR buffer, all or a subset of the CPL_line bits are actually used to modify the contents of the buffer. Pend has a fixed value through the calculation in a given cycle and is equal to: pend=256-xoff. This information is referred to as previous end and is maintained in signal "pend." For each cycle to cycle transition a new Cpl_line is formed with its correspondent group. The start and end bits are picked for each clock cycle. The start bit position will equal:start=pend+coff and the end bit position will equal: end=pend+coff+256.

Figure 6:
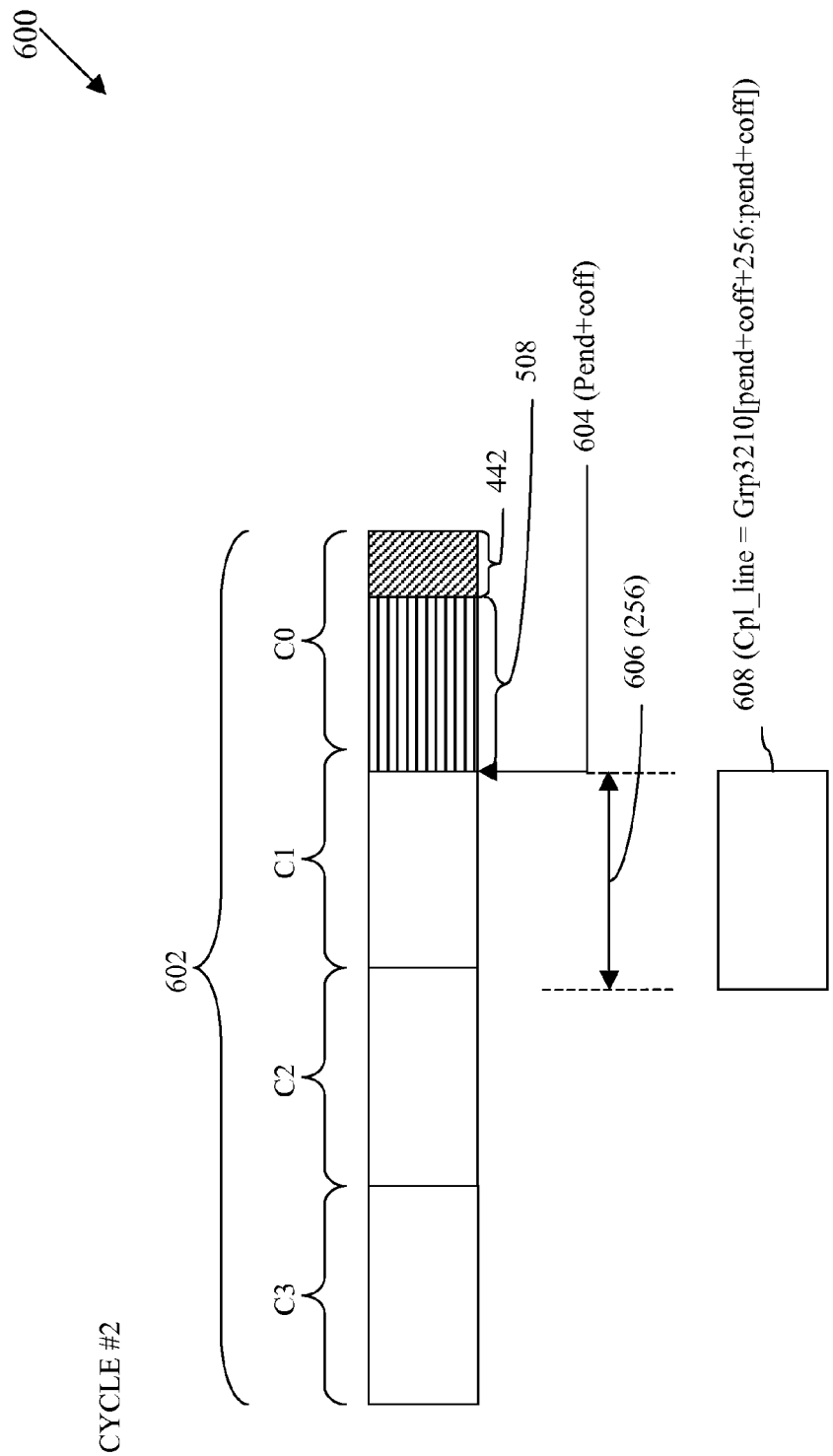
FIG. 6 illustrates a logical grouping of temporary storage for a second cycle from the architecture presented in FIG. 4A and FIG. 4B, according to embodiments of the invention.

FIG. 6 illustrates, generally at 600, a logical grouping of temporary storage for a second cycle from the architecture presented in FIG. 4A and FIG. 4B, according to embodiments of the invention. With reference to FIG. 6, completion lines C3, C2, C1, and C0 are logically grouped into a group 602 which is used to shift intended data to adjusted data for use in the second cycle. 508 indicates data that would have been read in the previous cycle, i.e., cycle one. The starting bit location for the second cycle is indicated at 604. The ending bit location for the second cycle is equal to: pend+coff+256. 256 bits are read in the second cycle as indicated at 606. The Cpl_line equation for the second cycle is given at 608 as {Cpl_line=Grp3210[pend+coff+256:pend+coff]}, where 3210 indicates the group formed by lines C3, C2, C1, and C0 from CPL flop array 400, starting bit location indicated by pend+coff and ending bit location indicated by pend+coff+256.

Figure 7:
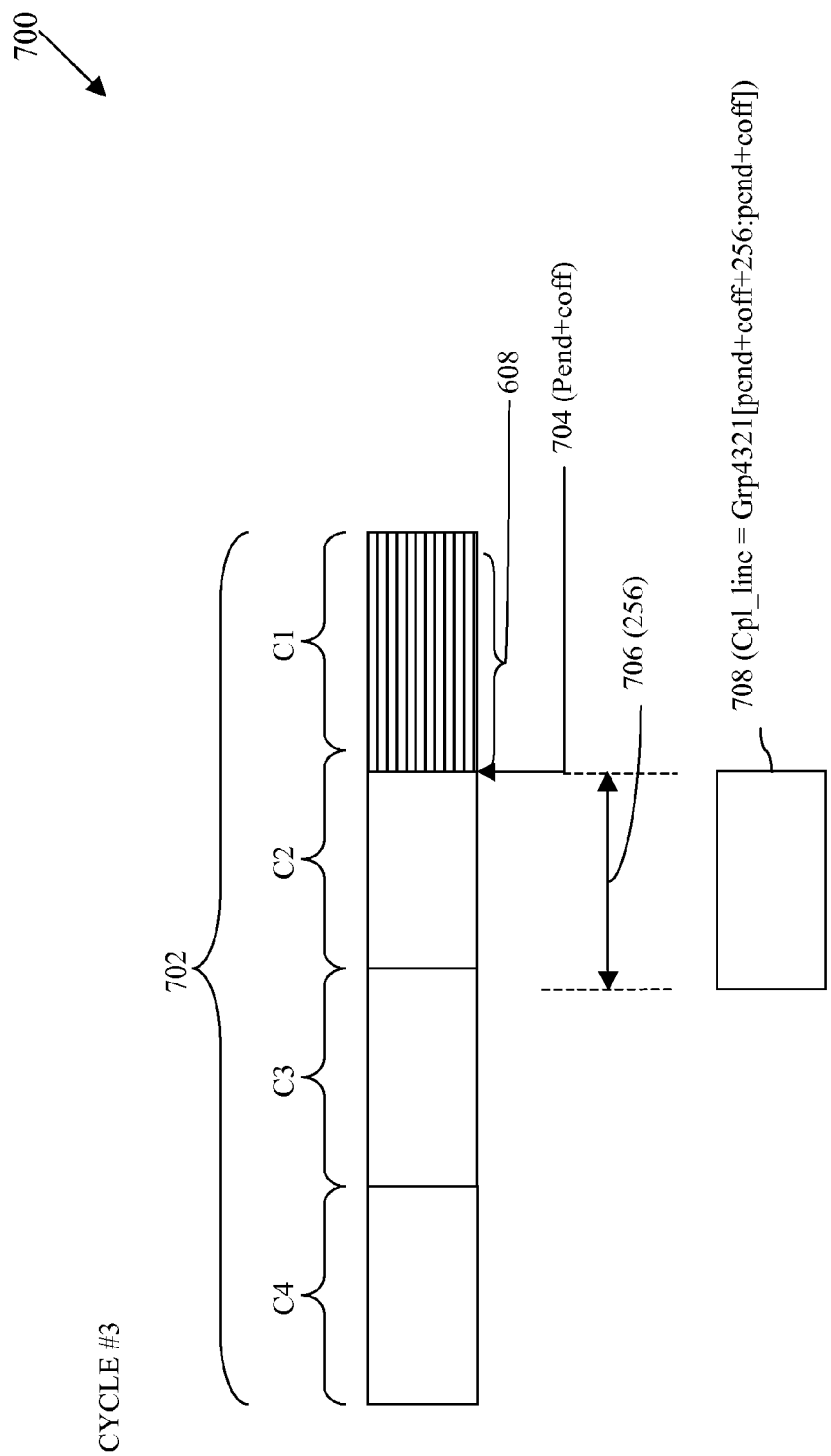
FIG. 7 illustrates a logical grouping of temporary storage for a third cycle from the architecture presented in FIG. 4A and FIG. 4B, according to embodiments of the invention.

FIG. 7 illustrates, generally at 700, a logical grouping of temporary storage for a third cycle from the architecture presented in FIG. 4A and FIG. 4B, according to embodiments of the invention. With reference to FIG. 7, completion lines C4, C3, C2, and C1 are logically grouped into a group 702 which is used to shift intended data to adjusted data for use in the third cycle. 608 indicates data that would have been read in the previous cycle, i.e., cycle two. The starting bit location for the third cycle is indicated at 704. The ending bit location for the third cycle is equal to: pend+coff+256. 256 bits are read in the third cycle as indicated at 706. The Cpl_line equation for the third cycle is given at 708 as {Cpl_line=Grp4321[pend+coff+256:pend+coff]}, where 4321 indicates the group formed by lines C4, C3, C2, and C1 from CPL flop array 400, starting bit location indicated by pend+coff and ending bit location indicated by pend+coff+256.

The fourth, fifth, and sixth cycles are processed in like manner to cycle three since these cycles process packed lines of data. The Cpl_line equations for cycles four, five, and six are illustrated in FIG. 11B.

Figure 8:
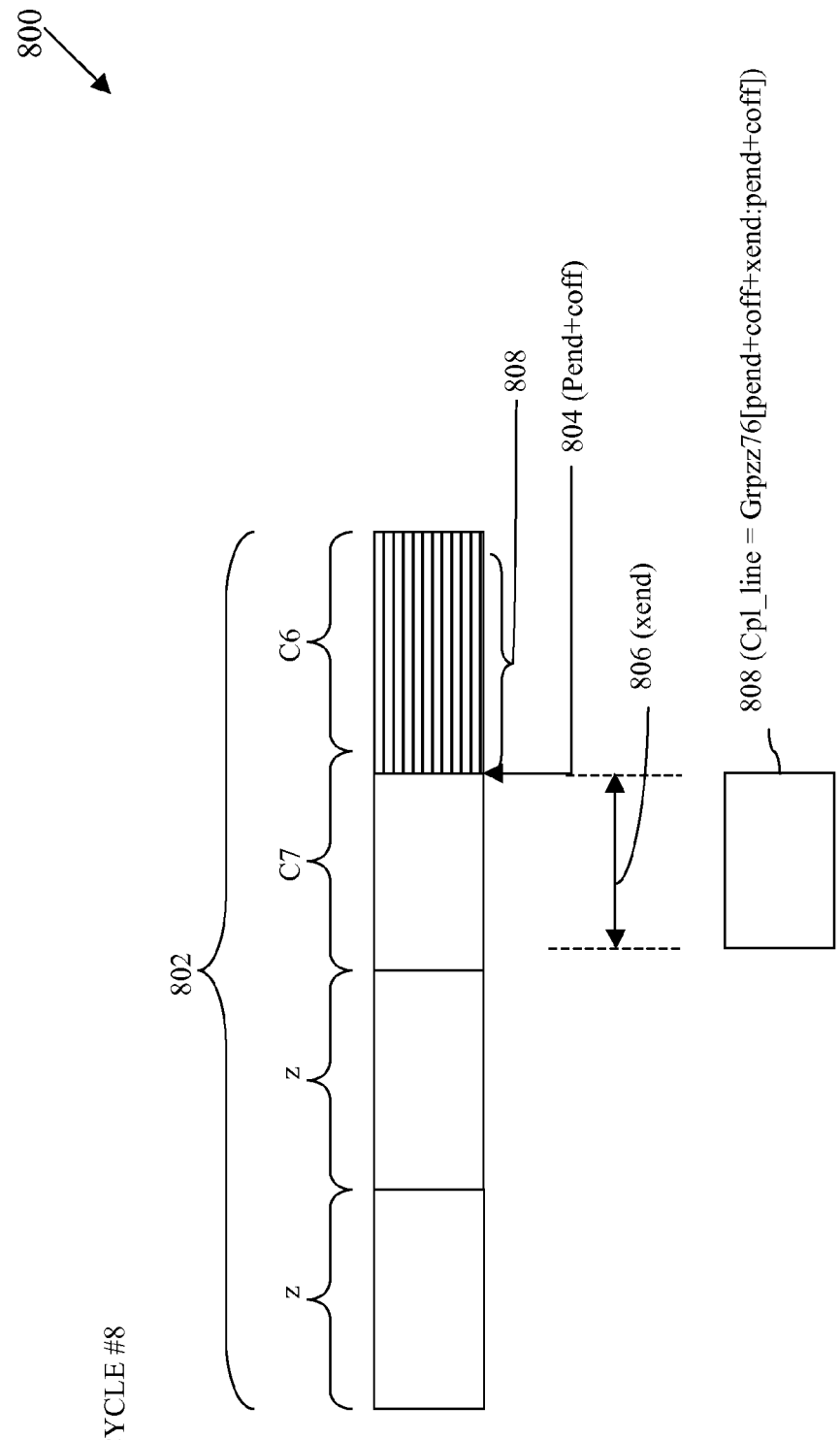
FIG. 8 illustrates a logical grouping of temporary storage for an eighth cycle from the architecture presented in FIG. 4A and FIG. 4B, according to embodiments of the invention.

FIG. 8 illustrates, generally at 800, a logical grouping of temporary storage for an eighth cycle from the architecture presented in FIG. 4A and FIG. 4B, according to embodiments of the invention. With reference to FIG. 8, completion lines Z, Z, C7, and C6 are logically grouped into a group 802 which is used to shift intended data to adjusted data for use in the eighth cycle. 808 indicates data that would have been read in the previous cycle, i.e., cycle seven. The starting bit location for the eighth cycle is indicated at 804. The ending bit location for the eighth cycle is equal to "xend." A number of bits read in the eighth cycle is equal to "xend" as indicated at 806. The Cpl_line equation for the eighth cycle is given at 808 as {Cpl_line=Grpzz76[pend+coff+xend:pend+coff]}, where zz76 indicates the group formed by lines Z, Z, 7, and 6 from CPL flop array 400, starting bit location indicated by pend+coff and ending bit location indicated by pend+coff+xend. Lines Z and Z indicate placeholders but do not represent actual storage locations in the CPL array from which data could be read from.

FIG. 9 illustrates, generally at 900, an alternative logical grouping of temporary storage for a first cycle from the architecture presented in FIG. 4A and FIG. 4B, according to embodiments of the invention. With reference to FIG. 9, completion lines C2, C1, C0, and Z are logically grouped into a group 902 which is used to shift intended data to adjusted data for use in the first cycle. Region 442 indicates bits in line C0 which are not part of the intended data are therefore skipped by virtue of the offset 904 into the CPL array. The starting bit location for the first cycle is indicated at 904. The ending bit location for the first cycle is equal to: 256-xoff. 256-xoff bits are read in the first cycle as indicated at 906. The Cpl_line equation for the alternative first cycle is given at 908 as {Cpl_line=Grp210z[coff+256-xoff+256:coff+256]}, where 210z indicates the group formed by lines C2, C1, C0, and Z from CPL flop array 400, starting bit location indicated by coff and ending bit location indicated by coff+256-xoff. Line Z indicates a placeholder but does not represent actual storage locations in the CPL array from which data could be read from. The alternative grouping of FIG. 9 yields results identical to those obtained with the grouping of FIG. 5.

FIG. 10 illustrates, generally at 1000, a logical grouping of temporary storage for a ninth cycle from the architecture presented in FIG. 4B, according to embodiments of the invention. It is often sufficient to use eight cycles to process an amount of intended data. However, in some instances nine cycles are required to process the intended data depending on the values of coff and xoff. With reference to FIG. 10, completion lines Z, Z, Z, and C7 are logically grouped into a group 1002 which is used to shift intended data to adjusted data for use in cycle nine. 1010 indicates data that would have been read in the previous cycle, i.e., cycle eight. The starting bit location for the eighth cycle is indicated at 1004. The ending bit location for the ninth cycle is equal to "xend." A number of bits read in the ninth cycle is equal to "xend" as indicated at 1006. The Cpl_line equation for the alternative ninth cycle is given at 1008 as {Cpl_line=Grpzzz7 [pend+coff+xend:pend+coff]}, where zzz7 indicates the group formed by lines Z, Z, Z, and 7 from CPL flop array 400, starting bit location indicated by pend+coff and ending bit location indicated by pend+coff+xend. Lines Z, Z, and Z indicate placeholders but do not represent actual storage locations in the CPL array from which data could be read from.

Figure 11A:
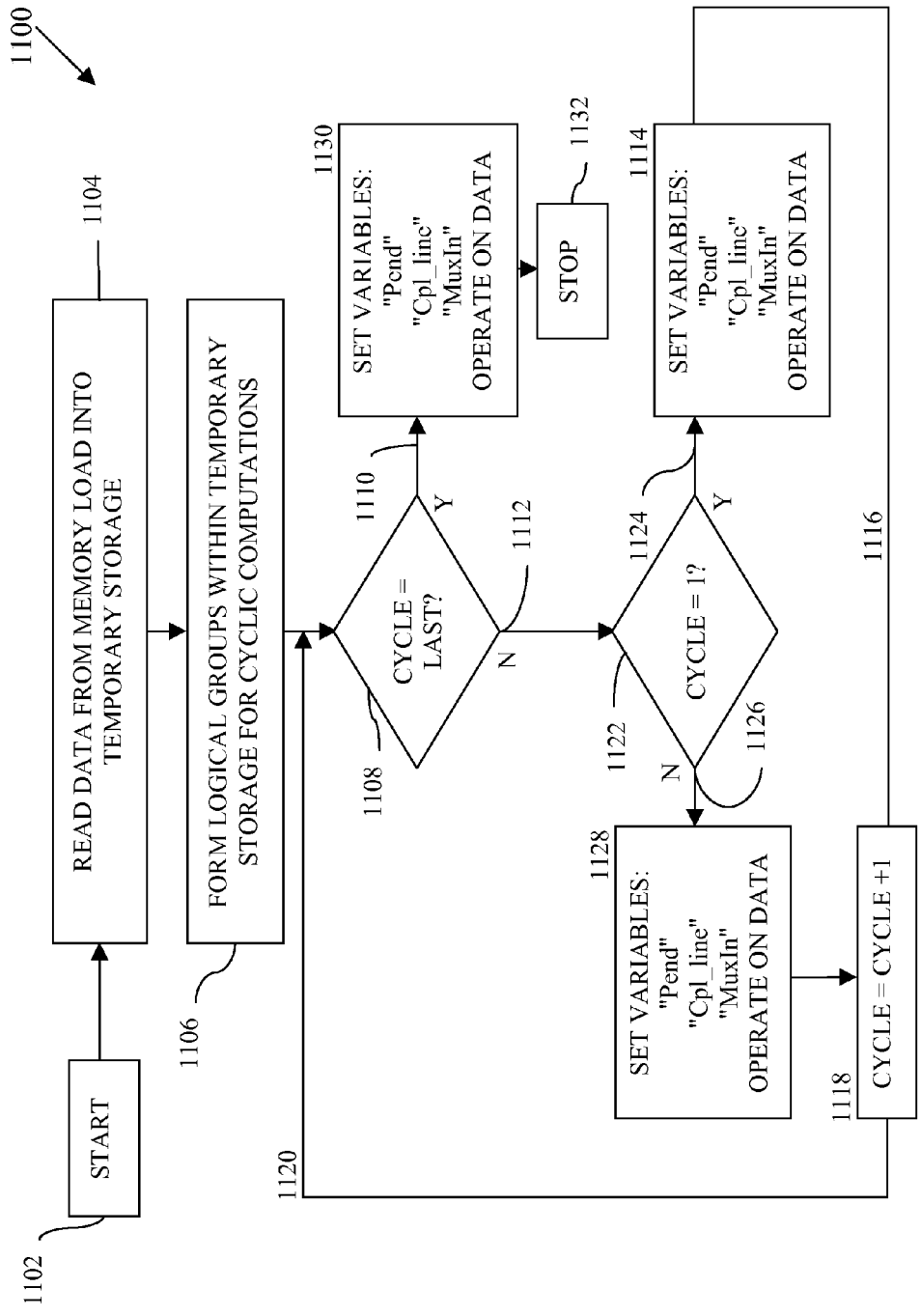
FIG. 11A illustrates a flow diagram, according to embodiments of the invention.

FIG. 11A illustrates, generally at 1100, a flow diagram, according to embodiments of the invention. With reference to FIG. 11A and FIG. 11B, a process to automatically align intended data with its corresponding location in an XOR buffer begins at a block 1102. At a block 1104 a processor issues a command to move data from DRAM to temporary storage. Temporary storage has been described above in conjunction with previous figures and an architecture of a CPL flops array has been illustrated in FIG. 4A. At a block 1106 logical groups are formed for computation within each clock cycle. Logical groups have been illustrated above in conjunction with FIG. 5 through FIG. 10.

At a block 1108 a last cycle number test is performed. If the current cycle is the last cycle then control transfers at 1110 to a block 1130. At this point, the cycle number is also the first cycle. Variables are established and a form of the completion line equation "Cpl_line" is established as illustrated in a table 1152 at a column 1154 (cycle 1) or in alternative form at a column 1156 (cycle 1). After the variables and the completion line equation are established in Block 1130 operation on the data takes place. Operation on the data includes forming adjusted data, reading the XOR buffer, performing the XOR operation, and writing XORed data back to the XOR buffer, all of which are described below in conjunction with FIG. 12. Control then transfers to a block 1132 where the process stops. If the current cycle is not the last cycle at 1108 then control transfers at 1112 to 1122 where cycle number is tested. During the first clock cycle control flows at 1124 to a block 1114 where the variables are established for the first cycle and the completion line equation "Cpl_line" is established as illustrated in table 1152 in column 1154 or the alternative form can be used as illustrated in column 1156. After the variables and the completion line equation are established in Block 1114 operation on the data takes place. Operation on the data includes forming adjusted data, reading the XOR buffer, performing the XOR operation, and writing XORed data back to the XOR buffer, all of which are described below in conjunction with FIG. 12.

After the operation on the data in the first cycle is completed control moves at 1116 to a block 1118 and the clock cycle is incremented. Control then flows at 1120 and the last cycle number test is performed at 1108. When the cycle number is not the last cycle, control transfers at 1112 to 1122. If the cycle number is not the first cycle then control transfers at 1126 to a block 1128. At the block 1128 the variables are established for the second cycle and the completion line equation "Cpl_line" is established as illustrated in table 1152 in column 1154 (cycle 2) or the alternative form can be used as illustrated in column 1156 (cycle 2). After the variables and the completion line equation are established in Block 1128 operation on the data takes place. Operation on the data includes forming adjusted data, reading the XOR buffer, performing the XOR operation, and writing XORed data back to the XOR buffer, all of which are described below in conjunction with FIG. 12. Control then transfers to the block 1118 where the cycle number is incremented. Control then transfers to 1120 and the cycle number is tested for the last cycle number at 1108.

If the current cycle tested in 1108 is the last cycle, then control transfers from 1110 to a block 1130 where variables are established for the last cycle (which could be any cycle from 1 to 9 depending on the size of intended data requested) and a form of the completion line equation "Cpl_line" is established as illustrated in table 1152 at column 1154 (cycle 8) or if needed at column 1156 (cycle 9), with appropriate adjustment made to the group of completion lines depending on which cycle constitutes the last cycle as established by the size of the offsets and the size of the data. For example, if the third cycle is the last cycle then in some embodiments, the group formed would use completion lines z432 for the third cycle. Operation on the data occurs at the block 1130 which includes forming adjusted data, reading the XOR buffer, performing the XOR operation, and writing XORed data back to the XOR buffer, all of which are described below in conjunction with FIG. 12. Control then transfers to a block 1132 where the process stops.

FIG. 11B illustrates, generally at 1150, equations for variables used in conjunction with the architecture of FIG. 4A through FIG. 12, according to embodiments of the invention. With reference to FIG. 11B, a table 1152 contains equations for the completion line variable "Cpl_line" which is used to group bits of intended data for input to a process to form adjusted data. One form for the Cpl_line equations is given in column 1154 for cycles 1, 2, 3, 4, 5, 6, 7, 8, and 9. Alternative forms of the Cpl_line equation is given for cycle 1 in column 1156. In the architecture described herein, the offset into the intended data, variable "coff" has a range of zero to 992 and the offset into the XOR buffer, variable "xoff" has a range of zero to 992. Note that different groupings of completion lines can be made with corresponding changes to the range of the completion offset range and the XOR buffer offset range.

Figure 12:
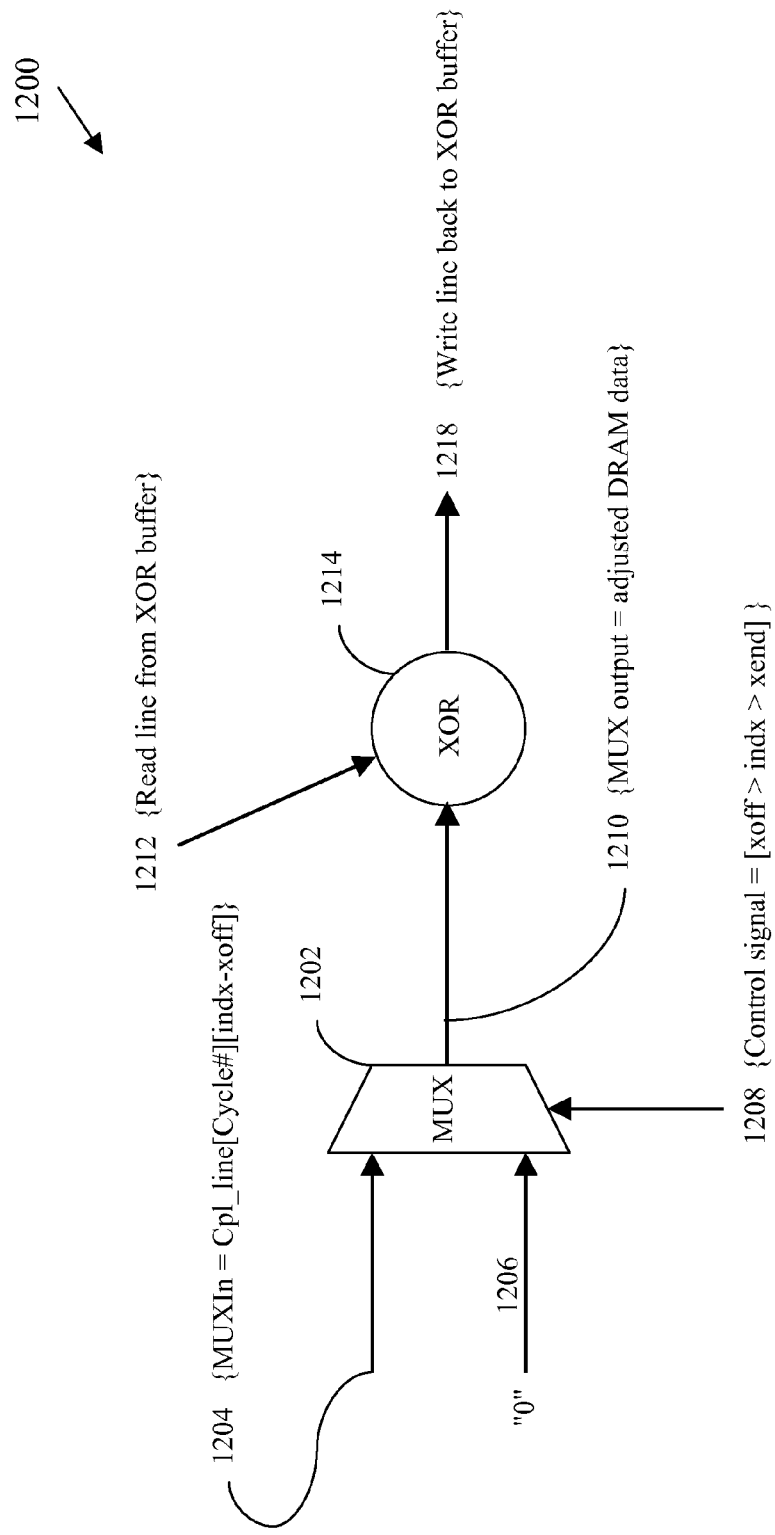
FIG. 12 illustrates a circuit for outputting adjusted data, according to embodiments of the invention.

FIG. 12 illustrates, generally at 1200, a circuit for outputting adjusted data, according to embodiments of the invention. With reference to FIG. 12, a multiplexer 1202 receives as inputs 1204 where a grouping of completion lines provides intended data from the CPL (completion) flops (used for temporary storage) and a zero value at 1206. The multiplexer receives a control signal at 1208. The input 1204 "MUXIn" is established cycle-by-cycle with the appropriate grouping of completion lines. "Cycle#" is an index for the Cpl_line grouping, the form of which is given in table 1152 (FIG. 11B) for each cycle. A variable "xoff" is the starting point within the XOR buffer. See for example 454 xoff in FIG. 4B which is the value of xoff used for cycle one to process the bits in the B0 line of the XOR buffer. During cycles two through eight, "xoff" is equal to zero (488 in FIG. 4B) while the bits in lines B1, B2, B3, B4, B5, and B6 are being processed in the XOR buffer because these lines are packed. A variable "xend" is equal to 256 for all cycles except the last cycle, where xend is computed based on the size of the intended data. For example, in FIG. 4B, 484 indicates xend equal to 256 for cycles operating on lines B0, B1, B2, B3, B4, B5, and B6. In cycle seven, xend is given at 476 xend.

A variable "indx" is a loop index which is used to apply the control condition to each bit of adjusted data moving through the multiplexer 1202. Variable indx ranges from zero to 255 and is reset to zero at the start of each cycle. The control signal 1208 applies the condition [xoff>indx>xend]. If a value of indx is less than xoff then zero is output from the multiplexer 1202. If the value of indx is greater than xoff then a bit from the intended data is output from the multiplexer 1202 as adjusted data. If the value of indx is greater than xend then zero at 1206 is output from the multiplexer 1202 as adjusted data 1210. In this way the intended data is automatically aligned with the XOR offset essentially shifting intended data from a position indicated qualitatively at 202 (FIG. 2) to position indicated qualitatively at 212 (FIG. 2).

Adjusted data 1210 is output from the multiplexer 1202 and is input to XOR circuit 1214 (e.g., XOR gate) along with corresponding data read from the XOR buffer 1212. The XORed data (output from the XOR circuit 1214) is written back to the XOR buffer at 1218. Note that at this point, the intended data has already been automatically shifted to its proper location, and all un-intended bits are set to zero such that this data can now simply be XORed with the contents of the XOR buffer directly. Note that an input A to the XOR operation is the output of the multiplexer adjusted DRAM data 1210 and the input B to the XOR operation is the data read from the XOR buffer. Thus, as illustrated in FIG. 3 at column 308 for rows 310 and 312, when A is zero; A XOR B returns the value originally in B. Therefore, the zero padded regions in the adjusted data 1210 (as illustrated qualitatively by 214 and 216 in FIG. 2) ensure that the regions in the XOR buffer that do not correspond with the intended data remain unchanged.

In various embodiments, the circuit depicted in 1200 (with or without additional components illustrated in the other figures) is implemented in an integrated circuit device, which may include an integrated circuit package containing the integrated circuit. As used in this description of embodiments, the term "integrated circuit" is used synonymously with the term "integrated circuit device." Note also that the term "integrated circuit" is understood to represent at least a part of an integrated circuit but not necessarily what would constitute an entire chip. In some embodiments, the circuit 1200 is implemented in a single integrated circuit die. In other embodiments, the circuit 1200 is implemented in more than one integrated circuit die of an integrated circuit device which may include a multi-chip package containing the integrated circuit. In various embodiments, the circuit indicated in 1200 contains the CPL flip flop array and the XOR buffer. The embodiments of the present invention are not limited to any particular semiconductor manufacturing technology. Embodiments of the present invention can be implemented using C-MOS, BIPOLAR, Silicon Germanium, or other process technology. The process technologies listed here are provided merely for example and do not limit embodiments of the invention.

FIG. 13 illustrates, generally at 1300, a data pipeline for accomplishing single clock cycle exclusive-OR (XOR) process, according to embodiments of the invention. With reference to FIG. 13, clock cycle number is indicated in a row 1302. A corresponding XOR read address, which is driven at the given clock cycle, is indicated by row 1304. A corresponding XOR read data, which is accessed at the given clock cycle, is indicated in a row 1306. A corresponding XOR write address, which is driven at the given clock cycle, is indicated in a row 1308. A corresponding XOR write data, which is written in the given clock cycle, is indicated in a row 1310. Note that reads and writes are happening in the same cycle but they are happening within different addresses (memory lines) in a given cycle. This allows a read-modify-write to occur in the same clock cycle which provides an XOR process with the minimum attainable execution time. In the example indicated at 1340, clock cycle 2 (n), XOR read address A2 is being accessed, D0 was read two clock cycles prior (n−2) from the XOR buffer and is being used to compute W0 which is written to the A0 address in clock cycle 2 (n). Thus, a read-modify-write is occurring within a single clock cycle but at different memory addresses corresponding to different memory lines within the XOR buffer.

Figure 14A:
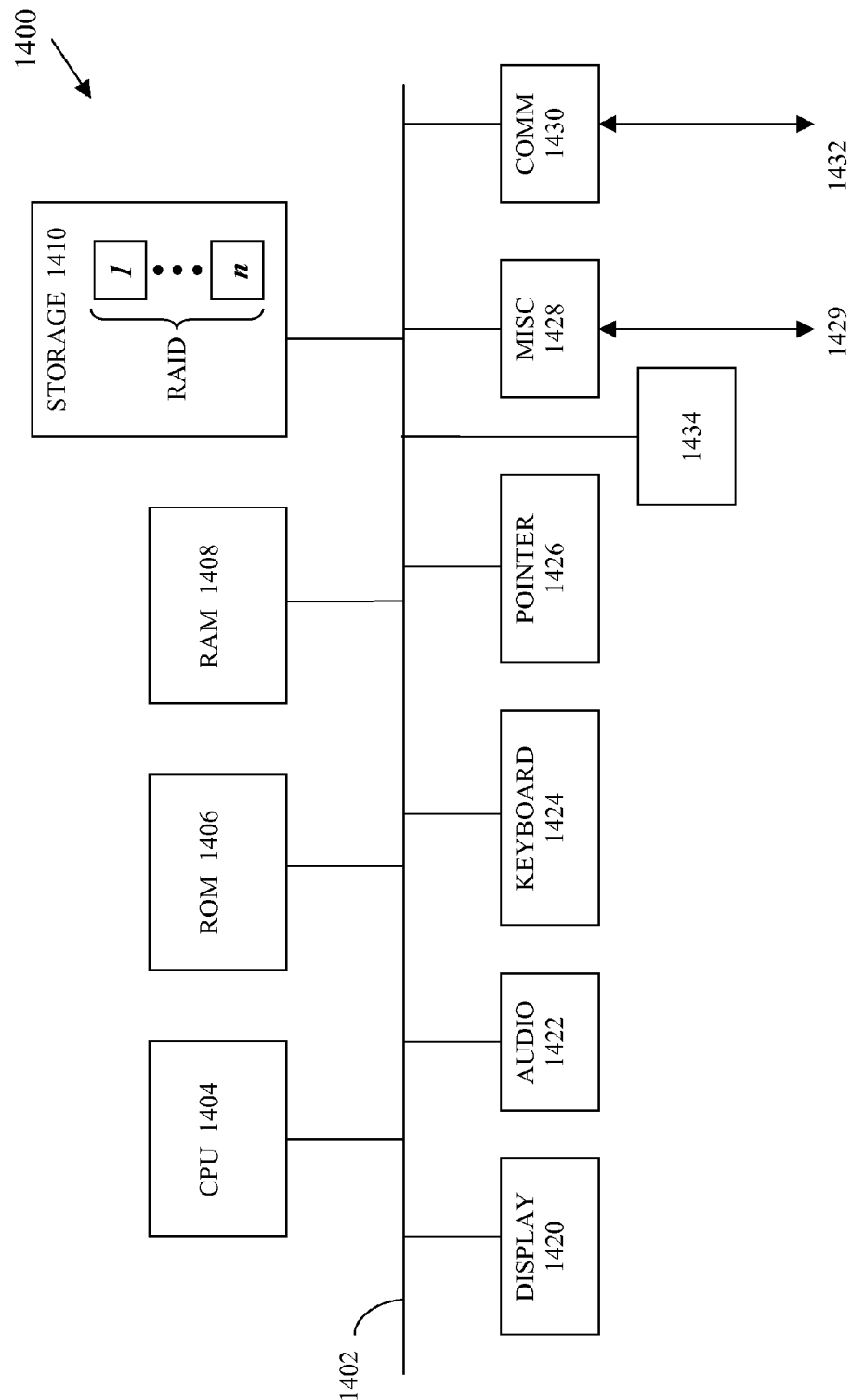
FIG. 14A illustrates a data processing system, according to embodiments of the invention.

FIG. 14A illustrates, generally at 1400, a data processing system, according to embodiments of the invention. With reference to FIG. 14A, as used in this description of embodiments, data processing system can be a device such as a computer, smart phone, tablet computer, etc. in which embodiments of the invention may be used. The block diagram is a high level conceptual representation and may be implemented in a variety of ways and by various architectures. Bus system 1402 interconnects a Central Processing Unit (CPU) 1404 (alternatively referred to herein as a processor), Read Only Memory (ROM) 1406, Random Access Memory (RAM) 1408, storage 1410, display 1420, audio, 1422, keyboard 1424, pointer 1426, miscellaneous input/output (I/O) devices 1428, and communications 1430. RAM 1408 can also represent dynamic random access memory (DRAM). It is understood that memory (not shown) can be included with the CPU block 1404. The bus system 1402 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 994 (FireWire), Universal Serial Bus (USB), etc. The CPU 1404 may be a single, multiple, or even a distributed computing resource. Storage 1410 may be Compact Disc (CD), Digital Versatile Disk (DVD), hard disks (HD), solid state disk (SSD), optical disks, tape, flash, memory sticks, video recorders, a redundant array of independent disks (RAID), etc. Note that depending upon the actual implementation of a computer system, the computer system may include some, all, more, or a rearrangement of components in the block diagram. Thus, many variations on the system of FIG. 14A are possible.

Embodiments of the invention are practiced within the architecture illustrated in 1400. For example, the CPU 1404 issues commands to retrieve intended data from memory 1408 (e.g. RAM or DRAM, etc.) or RAID array 1410, perform the processes described above to accomplish automatic alignment of intended data with an XOR buffer, perform XOR operation, and then write a stripe of data out to a RAID array 1410. In various embodiments, the elements in the figures illustrated above such as for example, memory, temporary storage, control logic, XOR buffer, etc. can be located on a card 1434 which connects to the bus 1402. In other embodiments, these elements can be located with the processor 1404. In yet other embodiments these elements are distributed between the components shown in FIG. 14A. In yet another embodiment RAID array 1410 coupled directly to card 1434 such that card 1434 extends between bus 1402 and RAID array 1410.

Connection with a network is obtained with 1432 via 1430, as is recognized by those of skill in the art, which enables the data processing device 1400 to communicate with devices in remote locations. 1432 and 1430 flexibly represent communication elements in various implementations, and can represent various forms of telemetry, GPRS, Ethernet, Wide Area Network (WAN), Local Area Network (LAN), Internet connection, WiFi, WiMax, etc. and combinations thereof.

In various embodiments, a pointing device such as a stylus is used in conjunction with a touch screen, for example, via 1429 and 1428.

Figure 14B:
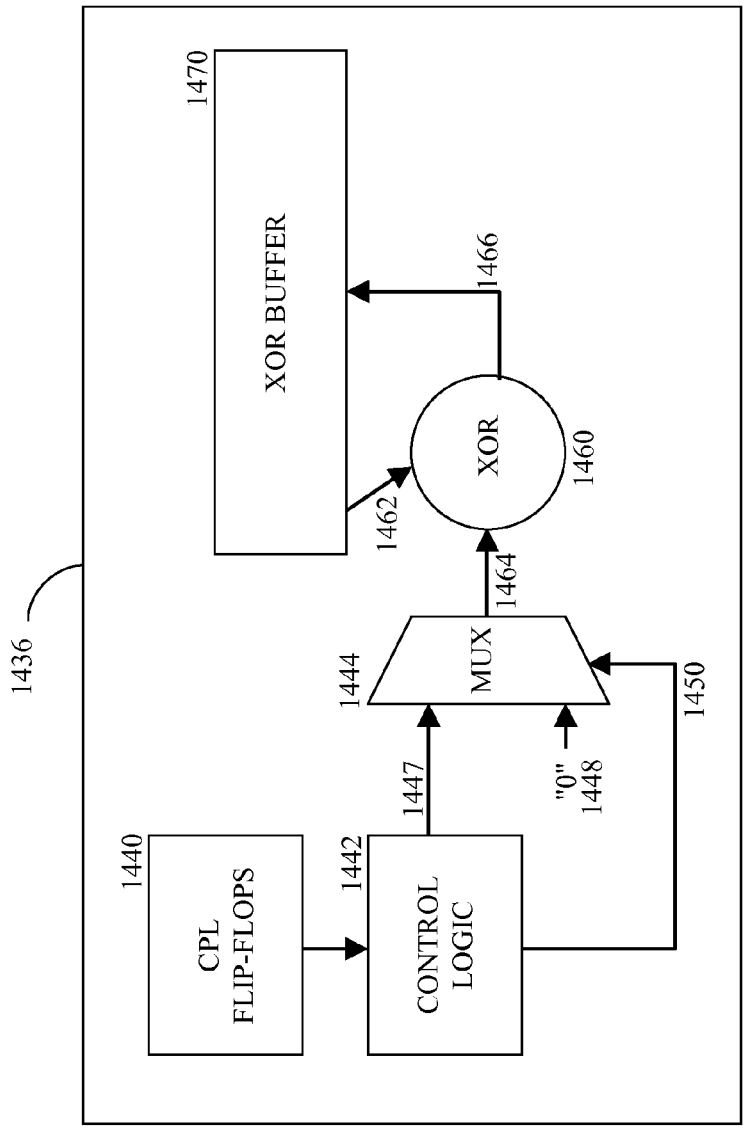
FIG. 14B illustrates the card from FIG. 14A, according to embodiments of the invention.

FIG. 14B illustrates the card from FIG. 14A, according to embodiments of the invention. With reference to FIG. 14B, in one embodiment components are grouped together to form an integrated circuit or part of an integrated circuit as indicated at 1436. One grouping of components includes temporary storage as represented by CPL flip-flops 1440, which is coupled to control logic 1442. Control logic 1442 organizes the lines of flops from 1440 into logical groups as described above in conjunction with the preceding figures, such as FIG. 5 through FIG. 10. Control logic 1442 provides a control signal 1450 to multiplexer 1444 as described above in conjunction with the preceding figures such as FIG. 11A, FIG. 11B, and FIG. 12. As described above in the discussion pertaining to the preceding figures, the control parameter 1450 is used to control the multiplexer 1444 such that zero values at 1448 are multiplexed with the data from temporary storage at 1447 to form adjusted data 1464. Adjusted data 1464 is XORed with data read at 1462 from the XOR buffer 1470 with an XOR circuit 1460. An output 1466 of the XOR circuit 1460 is written back to the XOR buffer 1470 at 1466.

In various embodiments, the circuit depicted in 1436 (with or without additional components illustrated in the other figures) is implemented in an integrated circuit device, which may include an integrated circuit package containing the integrated circuit. As used in this description of embodiments, the term "integrated circuit" is used synonymously with the term "integrated circuit device." Note also that the term "integrated circuit" is understood to represent at least a part of an integrated circuit but not necessarily what would constitute an entire chip. In some embodiments, the circuit 1436 is implemented in a single integrated circuit die. In other embodiments, the circuit 1436 is implemented in more than one integrated circuit die of an integrated circuit device which may include a multi-chip package containing the integrated circuit. The embodiments of the present invention are not limited to any particular semiconductor manufacturing technology. Embodiments of the present invention can be implemented using C-MOS, BIPOLAR, Silicon Germanium, or other process technology. The process technologies listed here are provided merely for example and do not limit embodiments of the invention. Moreover, in other embodiments of the present invention, circuit 1436 is directly coupled to RAID array 1410 and can extend between RAID array 1410 and bus 1402.

For purposes of discussing and understanding the embodiments of the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), dynamic random access memories (DRAM), electrically programmable read-only memories (EPROM)s, electrically erasable programmable read-only memories (EEPROMs), FLASH memories, magnetic or optical cards, RAID, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods herein may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

Non-transitory machine-readable media is understood to include any mechanism for storing information in a form readable by a machine (e.g., a computer). For example, a machine-readable medium, synonymously referred to as a computer-readable medium, includes read only memory (ROM); random access memory (RAM); magnetic disk storage media; optical storage media; flash memory devices; except electrical, optical, acoustical or other forms of transmitting information via propagated signals (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

While the invention has been described in terms of several embodiments, those of skill in the art will recognize that the invention is not limited to the embodiments described, but can be practiced with modification and alteration within the spirit and scope of the appended claims. The description is thus to be regarded as illustrative instead of limiting.

What is claimed is:

1. A method to increase exclusive-OR (XOR) computation speed, comprising:
reading a line of data from a line of memory, wherein intended data is specified by a random location and a random size within the line of memory;
moving the line of data into temporary storage;
multiplexing the line of data and a zero using a control signal to output a line of adjusted data, wherein a starting index of the intended data within the line of adjusted data corresponds to an initial point within an XOR buffer;
performing an XOR operation on the line of adjusted data and a line of data read from the XOR buffer to obtain a modified line of XOR data; and
writing the modified line of XOR data back to the XOR buffer at the same buffer locations as the line of data read from the XOR buffer.

2. The method of claim 1, wherein a command that initiates the reading is accompanied with the random location, the initial point, and the random size.

3. The method of claim 1, wherein the temporary storage is constructed with an array of flip-flops.

4. The method of claim 3, wherein the array is organized in eight lines of 256 flip-flops per line.

5. The method of claim 3, further comprising;
concatenating four successive lines of the array into a group during a given cycle.

6. The method of claim 5, wherein the eight lines are concatenated into eight groups of four successive lines, wherein a first group 3210 includes lines 3, 2 1, and 0, a second group 4321 includes lines 4, 3, 2, and 1, a third group 5432 includes lines 5, 4, 3, and 2, a fourth group 6543 includes lines 6, 5, 4, and 3, a fifth group 7654 includes lines 7, 6, 5, and 4, a sixth group z765 includes lines z, 7, 6, and 5, a seventh group zz76 includes lines z, z, 7, and 6, and an eighth group zzz7 includes lines z, z, z, and 7, where z represents unusable storage area.

7. The method of claim 1, wherein the multiplexing outputs adjusted data, the adjusted data is zero padded at all locations below the starting index and above the random size of intended data.

8. The method of claim 1, wherein steps A, B, and C are performed in the same clock cycle, the method further comprising:
(A) reading XOR buffer data from address n;
(B) wherein the performing uses XOR buffer data read from address n−2 and corresponding adjusted data to obtain an XOR output; and
(C) wherein the writing writes the XOR output from Step (B) to address n−2.

9. A system to increase exclusive-OR (XOR) calculation speed, comprising:
a processor, the processor to issue a command to move data from a memory to temporary storage, the command to specify intended data at a random location and of a random size within the memory and an initial point within an XOR buffer;
control logic to form at least one group of lines within the temporary storage and to provide a control signal using the command;
a multiplexer, the multiplexer controlled by the control signal to multiplex data from the at least one group of lines and a zero value to output adjusted data in alignment with the initial point within the XOR buffer; and
an XOR circuit, the XOR circuit to receive inputs of adjusted data and data read from an XOR buffer wherein an output of the XOR circuit is written back to the XOR buffer at the same XOR buffer locations as the data read from the XOR buffer.

10. The system of claim 9, wherein the random location and the random size is relative to a line of the memory, the control logic uses the command to provide the control signal to the multiplexer in order to output adjusted data such that a starting index of the intended data corresponds to the initial point within the XOR buffer, zero values exist in the adjusted data before the starting index and after the random size of the intended data.

11. An apparatus to increase exclusive-OR (XOR) calculation speed, comprising:
control logic to form at least one group of lines within a temporary storage array and to provide a control signal using a command issued from a processor, the temporary storage array to receive data from a memory in response to the command;
a multiplexer, the multiplexer controlled by the control signal to multiplex data from the at least one group of lines and a zero value to output adjusted data; and
an XOR circuit, the XOR circuit to receive inputs of adjusted data and data read from an XOR buffer wherein an output of the XOR circuit is written back to the XOR buffer at the same XOR buffer locations as the data read from the XOR buffer.

12. The apparatus of claim 11, wherein the command to contain a request for intended data at a random location and of a random size within a line of the memory, and a corresponding initial point within an XOR buffer, the control logic to use the command to provide the control signal to output the adjusted data such that a starting index of the intended data corresponds to the initial point within the XOR buffer, zero values exist in the adjusted data before the starting index and after the random size of the intended data.

13. The apparatus of claim 12, wherein timing is configured to read address n of the XOR buffer and to write to address n−2 of the XOR buffer during the same clock cycle.

14. The system of claim 12, wherein the output of the XOR circuit is part of a redundant array of independent disks (RAID) stripe.

15. The system of claim 14, wherein a level of RAID is RAID5.

16. The system of claim 14, wherein a stripe size is related to the random size of the intended data.

17. The system of claim 11, wherein the temporary storage array is constructed with flip-flops organized in eight lines of 256 flip-flops per line which form a contiguous array.

18. The system of claim 17, wherein the eight lines are concatenated into eight groups of four successive lines, wherein a first group 3210 includes lines 3, 2 1, and 0, a second group 4321 includes lines 4, 3, 2, and 1, a third group 5432 includes lines 5, 4, 3, and 2, a fourth group 6543 includes lines 6, 5, 4, and 3, a fifth group 7654 includes lines 7, 6, 5, and 4, a sixth group z765 includes lines z, 7, 6, and 5, a seventh group zz76 includes lines z, z, 7, and 6, and an eighth group zzz7 includes lines z, z, z, and 7, where z represents unusable storage area.

19. The system of claim 12, wherein a line size is selected from the group consisting of 256, 512, 2014, and a user defined size.

20. The system of claim 11, wherein the memory is a dynamic random access memory (DRAM) device.

* * * * *

UNITED STATES PATENT AND TRADEMARK OFFICE
CERTIFICATE OF CORRECTION

PATENT NO.       : 9,477,562 B1
APPLICATION NO.  : 14/694986
DATED            : October 25, 2016
INVENTOR(S)      : Mohammad Nikuie et al.

It is certified that error appears in the above-identified patent and that said Letters Patent is hereby corrected as shown below:

In the Specification

Column 5, Line 59-60 reads "{210 XOR offse + XOR size}", and should read --{210 XOR offset + 206 XOR size}--

Signed and Sealed this
Seventh Day of March, 2017

Michelle K. Lee
*Director of the United States Patent and Trademark Office*